United States Patent
Singha et al.

(10) Patent No.: US 10,420,240 B2
(45) Date of Patent: Sep. 17, 2019

(54) ARRANGEMENT FOR SUBSEA HOUSING OF ELECTRIC COMPONENTS AND MANUFACTURING OF THE SAME

(71) Applicant: ABB Schweiz AG, Baden (CH)

(72) Inventors: Santanu Singha, Västerås (SE); Tor Laneryd, Enköping (SE); Thomas Gradinger, Aarau Rohr (CH); Heinz Lendenmann, Västerås (SE)

(73) Assignee: ABB Schweiz AG, Baden (CH)

( * ) Notice: Subject to any disclaimer, the term of this patent is extended or adjusted under 35 U.S.C. 154(b) by 231 days.

(21) Appl. No.: 15/315,848

(22) PCT Filed: Jun. 3, 2015

(86) PCT No.: PCT/EP2015/062450
§ 371 (c)(1),
(2) Date: Dec. 2, 2016

(87) PCT Pub. No.: WO2015/185663
PCT Pub. Date: Dec. 10, 2015

(65) Prior Publication Data
US 2018/0020562 A1  Jan. 18, 2018

(30) Foreign Application Priority Data

Jun. 4, 2014  (EP) ..................................... 14171122

(51) Int. Cl.
*H05K 5/06* (2006.01)
*E21B 43/01* (2006.01)
(Continued)

(52) U.S. Cl.
CPC ............. *H05K 5/067* (2013.01); *E21B 43/01* (2013.01); *H01B 3/22* (2013.01); *H05K 7/20236* (2013.01);
(Continued)

(58) Field of Classification Search
USPC ......................................................... 174/520
See application file for complete search history.

(56) References Cited

U.S. PATENT DOCUMENTS 4,304,452 A * 12/1981 Kiefer ................... H01R 13/523
439/199
4,391,330 A *  7/1983 Kiefer ................... E21B 17/003
166/341

(Continued)

FOREIGN PATENT DOCUMENTS

EP  2487327 A1   8/2012
EP  2717401 A1 * 4/2014  ............... H02G 1/10
(Continued)

OTHER PUBLICATIONS

D. L. Hogenboom et al., Viscosity of several liquid hydrocarbons as a function of temperature, pressure and free volume, The Journal of Chemical Physics, vol. 46, No. 7, pp. 2586-2598, 1967.
(Continued)

*Primary Examiner* — William H. Mayo, III
*Assistant Examiner* — Krystal Robinson
(74) *Attorney, Agent, or Firm* — Whitmyer IP Group LLC

(57) ABSTRACT

A pressure compensated subsea arrangement for housing of electric components. The arrangement includes a pressure compensated housing. The pressure compensated housing is filled with a dielectric liquid. The arrangement includes at least one electric component. The at least one electric component is provided inside the pressure compensated housing. The dielectric liquid is a hydrocarbon dielectric liquid including isoparaffin. There is also provided a method of manufacturing such an arrangement.

19 Claims, 3 Drawing Sheets

(51) Int. Cl.
*H01B 3/22* (2006.01)
*H05K 7/20* (2006.01)
*E21B 41/00* (2006.01)

(52) U.S. Cl.
CPC ...... *H05K 7/20927* (2013.01); *E21B 41/0007* (2013.01)

(56) References Cited

U.S. PATENT DOCUMENTS

| | | | |
|---|---|---|---|
| 9,203,218 B2* | 12/2015 | Boe | H02G 1/10 |
| 2002/0139962 A1* | 10/2002 | Fefer | H01B 3/22 |
| | | | 252/570 |
| 2005/0024231 A1* | 2/2005 | Fincher | E21B 17/028 |
| | | | 340/854.4 |
| 2006/0100466 A1* | 5/2006 | Holmes | C10M 105/04 |
| | | | 585/1 |
| 2006/0100467 A1 | 5/2006 | Holmes et al. | |
| 2013/0175041 A1* | 7/2013 | Nellessen, Jr. | E21B 33/0355 |
| | | | 166/336 |
| 2014/0098465 A1* | 4/2014 | Bendale | H01G 11/68 |
| | | | 361/502 |
| 2015/0364229 A1* | 12/2015 | Singha | H01B 3/22 |
| | | | 174/30 |

FOREIGN PATENT DOCUMENTS

| | | |
|---|---|---|
| EP | 2717401 A1 | 4/2014 |
| EP | 2770512 A1 | 8/2014 |
| WO | 2006060269 A2 | 6/2006 |

OTHER PUBLICATIONS

European Search Report Application No. EP14171122 Completed: Jan. 16, 2015; dated Jan. 23, 2015 7 pages.
International Search Report & Written Opinion of the International Searching Authority Application No. PCT/EP2015/062450 Completed: Mar. 22, 2016; dated Apr. 1, 2016 13 pages.
Petro-Canada: "Luminol Product from Petro-Canada for Subsea Oil Gas Application", Apr. 15, 2014 (Apr. 15, 2014), Retrieved from the Internet: URL:http://www.subsea.org/products/specifi cation.asp?prod4= 906 [retrieved on Jan. 7, 2015].
M. Koch et al., "The breakdown voltage of insulation oil under the influence of humidity, acidity, particles and pressure", International Conference of APTADM, 2007.
Petro: "Petro-Canada TechData Luminol", Dec. 31, 2013 (Dec. 31, 2013), Retrieved from the Internet: URL:http://lubricants.petro-canada.ca/resource/download.aspx?type=TechData&iproduct=1780&language=en [retrieved on Mar. 22, 2016].
R. Badent et al., "The effect of hydrostatic pressure on streamer inception and propagation in insulating oil", Conference Record of the IEEE International Symposium on Electrical Insulation, 1994.
Written Opinion of the International Preliminary Examining Authority Application No. PCT/EP2015/062450 dated Sep. 1, 2016 5 pages.

\* cited by examiner

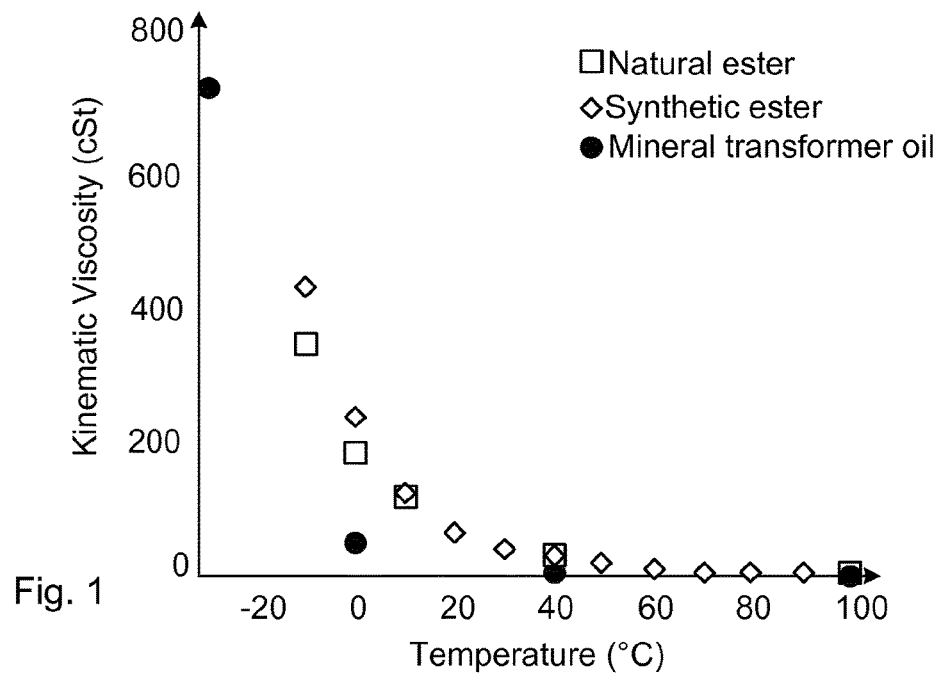
Fig. 1
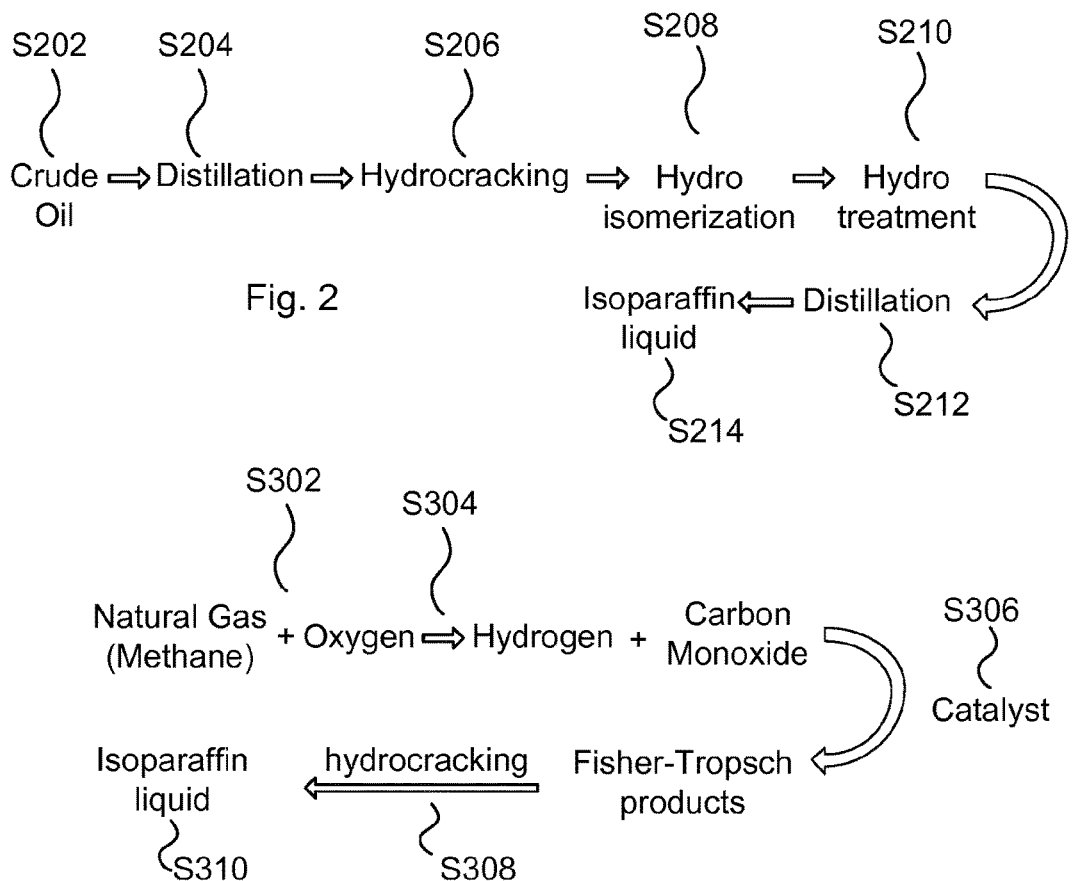
Fig. 2
Fig. 3

ARRANGEMENT FOR SUBSEA HOUSING OF ELECTRIC COMPONENTS AND MANUFACTURING OF THE SAME

TECHNICAL FIELD

The invention relates to housing of electric components, and particularly to a pressure compensated subsea arrangement for housing of electric components. Embodiments presented herein further relate to manufacturing of such an arrangement.

BACKGROUND

The oil and gas industry is continuously searching for more dispersed, deeper and smaller fields under the sea and further offshore. This has led to a strong interest in the development of subsea technology that can enable cost-effective deep sea oil/gas exploration and recovery. Today, power electronics for driving large compressor and pump loads are located at atmospheric pressures either on-shore or on a platform with long cable connections. In the past few years, a pressure compensated concept has been extensively discussed for subsea technology. In a pressure compensated system, the electrical components (e.g. power conversion unit) and associated electronic circuits will be put under pressure close to or equal to the external pressure (which is high, e.g. 300 bar at 3000 meters depth) in a pressure compensated vessel filled with a dielectric liquid medium. The same type of pressure compensated systems is also used for subsea installations of static electric induction devices such as subsea transformers.

The development of such a pressure compensated system generates unique challenges with respect to the design of the electrical components and cooling of the entire system. One of the critical components of such a system is the liquid medium itself. This is because the dielectric breakdown behavior and thermal properties of the liquid at high pressures and low temperatures will determine the reliability of the power conversion unit and the size of the pressure compensated enclosure. Literature mentions that the dielectric properties of an insulating liquid are generally enhanced under high pressure conditions, see for example M. Koch et al., "The breakdown voltage of insulation oil under the influence of humidity, acidity, particles and pressure", International Conference of APTADM, 2007, or R. Badent et al., "The effect of hydrostatic pressure on streamer inception and propagation in insulating oil", Conference Record of the IEEE International Symposium on Electrical Insulation, 1994. However, the thermal properties of an insulating liquid at high pressures have to be understood and addressed appropriately during the design of the pressure compensated system.

It is well known that the viscosity of a liquid increases at low temperatures. This is shown in the graph of FIG. 1 illustrating variation of kinematic viscosity of three dielectric oils (natural ester, synthetic ester, and mineral transformer oil) with respect to temperature. In addition, the viscosity is also reported to increase significantly under high pressures, see for example D. L. Hogenboom et al., "Viscosity of several liquid hydrocarbons as a function of temperature, pressure and free volume", The Journal of Chemical Physics, Vol. 46, No. 7, pp. 2586-2598, 1967. As a result, the cooling performance of the liquid at high pressures and low temperatures is a cause for concern.

Often, to achieve high reliability, cooling solutions based on natural convection are sought. In such a case, high viscosity of the cooling medium lowers the flow rates and thus the cooling performance. If, on the other hand, pumped cooling is chosen, the high viscosity of the cooling medium increases the needed pumping power. Another critical material property of the liquid is the thermal conductivity. For a sea water cooled natural convection cooling system intended to work under high pressure, the low oil heat transfer coefficient typically represents the highest thermal resistance in the system. A high thermal conductivity is therefore a significant advantage for the cooling medium.

EP 2717401 A1 relates to a subsea electrical power system comprising a first and a second subsea electrical device, and to a method of providing a subsea electrical power system.

US 2002/139962 A1 relates to dielectric fluids for use in transformers. In particular, it relates to dielectric isoparaffinic based transformer fluids.

Petro-Canada: "Luminol Product from Petro-Canada for Subsea Oil Gas Application" very briefly describes "Luminol", or a luminol synthesized isoparaffin fluid. This document refers to the subsea oil and gas industry but does not explicitly mention a pressure compensated subsea arrangement.

Hence, there is still a need for an efficient dielectric liquid to be used in subsea power systems.

SUMMARY

An object of embodiments herein is to provide an efficient dielectric liquid to be used in subsea power systems.

According to a first aspect there is presented a pressure compensated subsea arrangement for housing of electric components. The arrangement comprises a pressure compensated housing. The pressure compensated housing is filled with a dielectric liquid. The arrangement comprises at least one electric component. The at least one electric component is provided inside the pressure compensated housing. The dielectric liquid is a hydrocarbon dielectric liquid comprising isoparaffin.

Advantageously this provides an efficient dielectric liquid to be used in subsea power systems.

Advantageously this provides an insulating liquid solution that has significantly enhanced thermal characteristics at high pressures and low temperatures, apart from having excellent dielectric behaviors for high voltage applications.

Advantageously, the use of an isoparaffin based hydrocarbon liquid will lead to an efficient thermal design of the arrangement which in turn will increase the reliability of the arrangement when used in a subsea environment.

Advantageously, as compared to other insulating fluids, the use of isoparaffin liquid will result in an arrangement with smaller footprint, thereby influencing the product cost significantly. For subsea installations, this is of particular importance, since the weight of the subsea equipment is limited by the crane systems of the ships used for installing and retrieving the equipment.

According to an embodiment the hydrocarbon dielectric liquid comprises at least 50 volume percent (Vol %) isoparaffin. For example, the hydrocarbon dielectric liquid may comprise least 51 Vol % isoparaffin.

According to an embodiment the hydrocarbon dielectric liquid has a dynamic viscosity at 4° C. of about 100 mPa to about 500 mPa between a pressure of about 100 bar to about 1000 bar.

According to an embodiment the hydrocarbon dielectric liquid has a dynamic viscosity at 4° C. of above about 500 m·Pas at a pressure above about 1000 bar.

According to an embodiment the hydrocarbon dielectric liquid has a thermal conductivity above 0.10 W/(m K) at about 30° C. temperature and about 1 bar pressure.

According to an embodiment the hydrocarbon dielectric liquid has a dynamic viscosity less than 10 mPa·s at 50° C. and at 300 bar and has a thermal conductivity above 0.13 W/(m K) at 50° C. and at 300 bar. Simulations and some experiments show that a hydrocarbon dielectric liquid with these parameter values have sufficient heat carrying capacity and the viscosity is low enough, even at high pressure, for natural convection cooling to be efficient in a pressure compensated subsea arrangement for housing of electric components.

The inventor has found out that installing the pressure compensated subsea arrangement for housing of electric components at a depth of 100 m (corresponding to a pressure of 11 bar) or more, the use of hydrocarbon dielectric liquid comprising isoparaffin is essential. At depths less than 100 m other types of dielectric liquids might be usable, but a dielectric liquid comprising isoparaffin has substantial advantages in that it has still lower dynamic viscosity and higher thermal conductivity than such other types of dielectric liquids.

According to an embodiment the hydrocarbon dielectric liquid has a flash point above 165° C.

According to an embodiment one of the at least one electric component is part of a semiconductor submodule.

According to an embodiment one of the at least one electric component is part of a power electronics building block (PEBB).

According to a second aspect there is presented a method of manufacturing a pressure compensated subsea arrangement for housing of electric components. The method comprises providing a pressure compensated housing. The method comprises providing at least one electric component inside the pressure compensated housing. The method comprises filling the pressure compensated housing with a dielectric liquid. The dielectric liquid is a hydrocarbon dielectric liquid comprising isoparaffin.

According to an embodiment the method comprises lowering the housing into a body of water. The body of water may be an ocean or a lake.

It is to be noted that any feature of the first and second aspects may be applied to any other aspect, wherever appropriate. Likewise, any advantage of the first aspect may equally apply to the second aspect, respectively, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which:

FIG. 1 is a graph illustrating variation of kinematic viscosity of dielectric oils with respect to temperature;

FIG. 2 schematically illustrates a Hydrocracking/Hydro-isomerization process;

FIG. 3 schematically illustrates GTL technology using a Fisher-Tropsch process;

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 6:
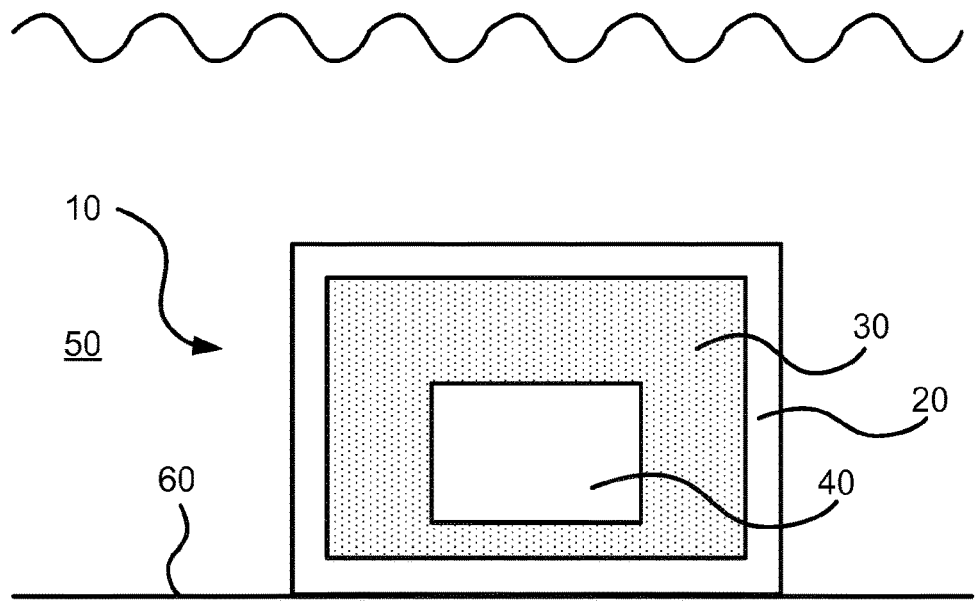
FIG. 6 is a schematic diagram illustrating an arrangement for subsea housing of electric components according to an embodiment.

FIG. 6 is a schematic diagram illustrating a pressure compensated subsea arrangement 10 for housing of electric components according to an embodiment. The herein disclosed embodiment are based on using an insulating liquid solution that, compared to known insulating liquids used in arrangements for subsea housing of electric components, has significantly enhanced thermal characteristics at high pressures and low temperatures, apart from having excellent dielectric behaviors for high voltage applications.

The arrangement 10 comprises a pressure compensated housing 20. The pressure compensated housing 20 is filled with a dielectric liquid 30. The arrangement 10 further comprises at least one electric component 40. The at least one electric component 40 is provided inside the pressure compensated housing 20. The dielectric liquid 30 is a hydrocarbon dielectric liquid comprising isoparaffin.

Pressure equalisation in a pressure compensated vessel can be achieved by filling the vessel with a liquid, such as a dielectric liquid, and by means of a mechanically flexible pressure compensation device, referred to as a compensator, to compensate for possible liquid volume changes due to pressure and temperature changes. Thus the pressure compensated housing 10 may be arranged with a pressure compensating device (not shown). In the illustrative example illustrated in FIG. 6 the arrangement 10 is provided at the seabed 60 of a body of water 50. The body of water 50 may be an ocean or a lake. For example, the arrangement 10 may be installed at a water depth of about 1000 m or more.

The pressure compensated vessel is designed so that the normal operating temperature of the liquid in the pressure compensated vessel will be 50-70 degrees Celsius under normal load of the electric components in the vessel.

According to the herein disclosed arrangements it is thus proposed to use an isoparaffin based insulating liquid solution that has significantly enhanced thermal characteristics at high pressures and low temperatures, apart from having excellent dielectric behaviors for high voltage applications. The differences in the thermal properties of this proposed dielectric liquid compared to state of the art is attributed to the chemistry of the liquid medium.

Different embodiments relating to the dielectric liquid 30 will now be described in turn.

According to an embodiment the herein disclosed hydrocarbon dielectric liquid comprises at least 50 volume percent (Vol %) isoparaffin. For example, the hydrocarbon dielectric liquid may comprise at least 51 Vol % isoparaffin. Preferably, the hydrocarbon dielectric liquid comprises an even higher share of isoparaffin, such as at least 70 Vol % isoparaffin; preferably more than 70 Vol % isoparaffin.

The isoparaffin liquid can be derived through severe hydrocracking and hydro-isomerization process of crude oil or through Gas to Liquid (GTL) technology which utilizes the Fischer-Tropsch process. FIG. 2 schematically illustrates a Hydrocracking/Hydro-isomerization process. The process comprises in a step S202 providing a crude oil. The process comprises in a step S204 applying a distillation process to the crude oil. The process comprises in a step S206 applying a hydrocracking process to the product obtained in step S204. The process comprises in a step S208 applying a hydro isomerization process to the product obtained in step S206. The process comprises in a step S210 applying a hydro treatment process to the product obtained in step S208. The process comprises in a step S212 applying a distillation process to the product obtained in step S210. The process comprises in a step S214 obtaining the isoparaffin liquid as the product obtained in step S212. FIG. 3 schematically illustrates GTL technology using Fisher-Tropsch process. The process comprises in a step S302 adding oxygen to natural gas (such as Methane). The process comprises in a step S304 applying an oxidation process to the oxygen and natural gas so as to obtain hydrogen and carbon monoxide. The process comprises in a step S306 applying a catalyst process to the hydrogen and carbon monoxide so as to obtain Fischer-Tropsch products. The process comprises in a step S308 applying a hydrocracking process to the Fischer-Tropsch products. The process comprises in a step S310 obtaining the isoparaffin liquid as the product obtained in step S308.

Experimental results demonstrate that an isoparaffin liquid has better viscosity characteristics over traditionally used mineral oil, synthetic ester and silicone oil under high pressure environments.

According to an embodiment the herein disclosed hydrocarbon dielectric liquid has a dynamic viscosity at 4° C. of about 100 m·Pas to about 500 mPa between a pressure of about 100 bar to about 1000 bar. According to an embodiment the herein disclosed hydrocarbon dielectric liquid has a dynamic viscosity at 4° C. of above about 500 m·Pas at a pressure above about 1000 bar.

Figure 4:
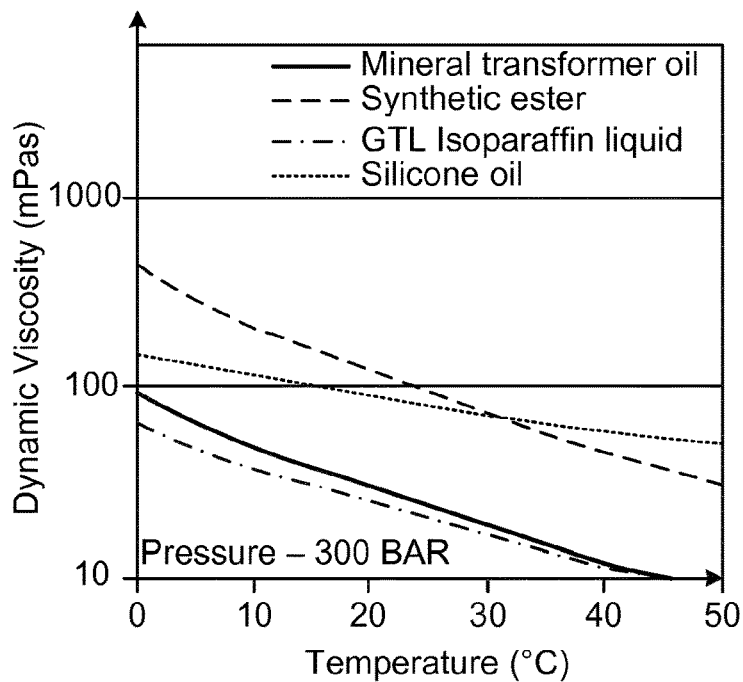
FIG. 4 is a graph illustrating variation of the dynamic viscosity in different oils with respect to temperature at a pressure of 300 bar.

FIG. 4 schematically illustrates variation of the dynamic viscosity in different oils with respect to temperature at a pressure of 300 bar. From FIG. 4 it can be seen that the isoparaffin liquid has lower dynamic viscosities. At still higher pressures, the isoparaffin liquid is observed to have an advantage of at least 2.5 times lower dynamic viscosities than traditional mineral transformer oil at 1000 bar and 4° C. over the other oils.

In general terms, thermal conductivity (often denoted k, A, or K) is the property of the dielectric liquid to conduct heat. It is evaluated primarily in terms of Fourier's Law for heat conduction. According to an embodiment the herein disclosed hydrocarbon dielectric liquid has a thermal conductivity above 0.10 W/mK at about 30° C. temperature and about 1 bar pressure.

According to an embodiment the hydrocarbon dielectric liquid has a dynamic viscosity less than 10 m·Pas at 50° C. and at 300 bar and has a thermal conductivity above 0.13 W/(m K) at 50° C. and at 300 bar.

Figure 5:
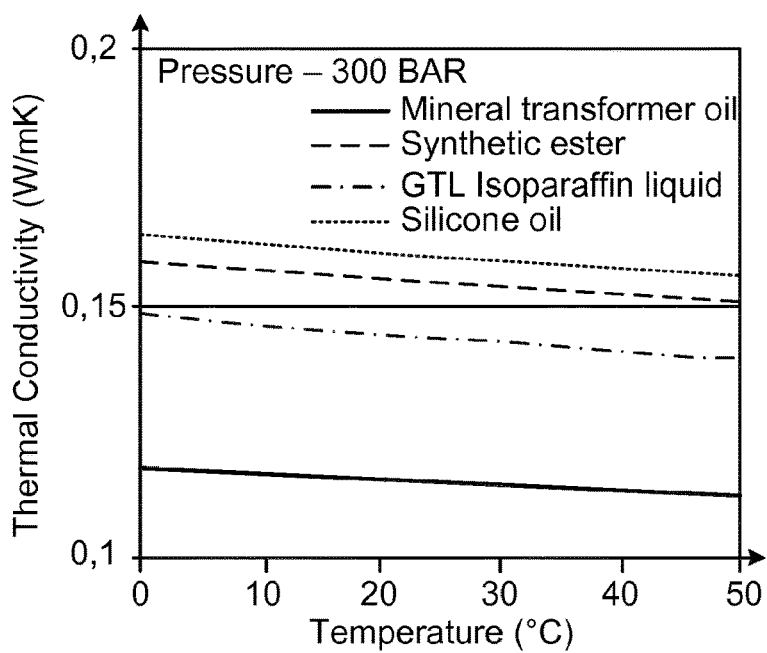
FIG. 5 is a graph illustrating variation of the thermal conductivity in different oils with respect to temperature at a pressure of 300 bar.

The high thermal conductivity of an isoparaffin liquid as compared to mineral oil at high pressures means significantly increased heat transfer coefficient for the oil. The advantages of an isoparaffin liquid over other dielectric liquids start to be more significant at pressures above 100 bars. FIG. 5 schematically illustrates variation of the thermal conductivity in different oils with respect to temperature at a pressure of 300 bar.

In general terms, the flash point of the dielectric liquid is the lowest temperature at which the dielectric liquid can vaporize to form an ignitable mixture in air. Measuring a flash point generally requires an ignition source. At the flash point, the vapor may cease to burn when the source of ignition is removed. According to an embodiment the herein disclosed hydrocarbon dielectric liquid has a flash point above 165° C.

The dielectric liquid 30 and the pressure compensated housing 20 act as a cooling system for the at least one electric component 40. When provided in a body of water 50 also the body of water 50 may be part of the cooling system for the at least one electric component 40. Thermal analysis for relevant geometries have shown that this advantage in the dynamic viscosity and thermal conductivity has a significant impact on the design of the cooling system in a pressure compensated electrical system, particularly at increasing ocean depths. More importantly, the size of the pressure compensated housing 20 (and thus of the arrangement 10) with an isoparaffin liquid may be significantly reduced compared to similar arrangements comprising conventional transformer mineral oil, synthetic ester liquid, or silicone oil as dielectric liquid.

Silicone oil is less environmentally friendly because silicone oil is less biodegradable. Silicone oil leaking into water is a worse problem that other types of dielectric liquid, such as mineral oil, synthetic ester liquid or isoparaffin liquid, leaking into water. Therefore, silicon oil should be avoided for pressure compensated subsea arrangements for housing of electric components. Silicon oil is difficult to clean if it contaminates anything. For small encapsulated components, silicone oil is good; however, for a large system, as herein considered, it is difficult to use silicone oil.

Apart from the above mentioned advantages, an isoparaffin liquid has excellent dielectric properties and oxidation stability behaviors that are similar to traditional mineral oil characteristics. Further, the biodegradability of an isoparaffin liquid is better (>40%) than the traditional mineral oil used in transformers.

Embodiments relating to further details of the arrangement 10 will now be disclosed.

There are different examples of electric components 40 that could be provided inside the pressure compensated housing 20. For example, each one of the at least one electric component 40 may be part of a power conversion unit or a static electric induction device. For example, each one of the at least one electric component 40 may be part of a semiconductor submodule. For example, each one of the at least one electric component 20 may be part of a power electronics building block (PEBB). Here, the term PEBB should be interpreted as any mechanical assembly of power electronic components. The PEBBs may be suitable for use in voltage source converters. The voltage source converters may be configured for various applications, such as power quality, static frequency conversion, dynamic VAr compensation, and power conditioning systems for energy storage. For example, each one of the at least one electric component 20 may be part of an insulated-gate bipolar transistor (IGBT) power semiconductor element.

Figure 7:
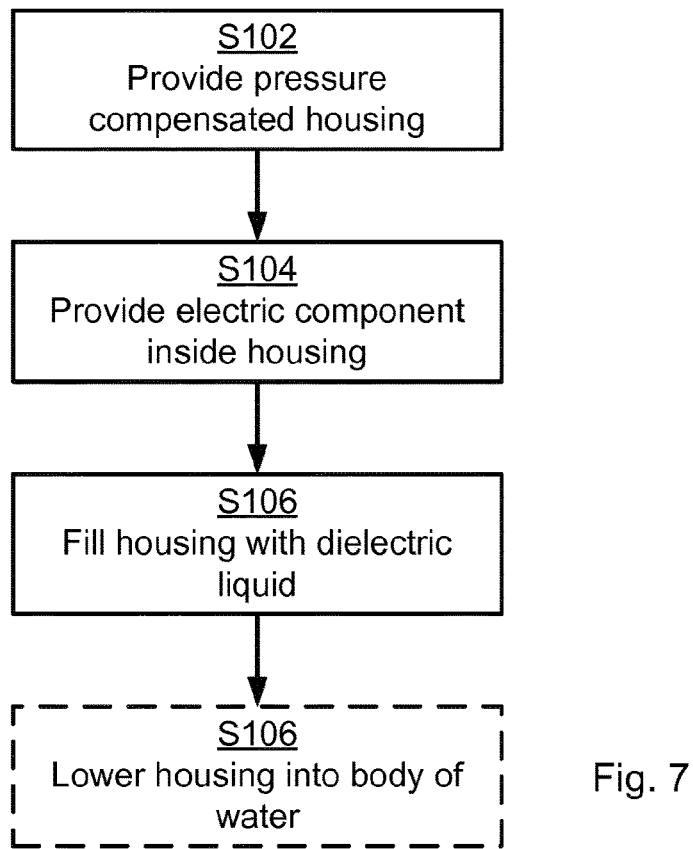
FIG. 7 is a flowchart of methods according to embodiments.

FIG. 7 is a flowchart of methods for manufacturing a pressure compensated subsea arrangement 10 for housing of electric components as herein disclosed according to embodiments.

The method comprises in a step S102 providing a pressure compensated housing 20. The method comprises in a step S104 providing at least one electric component 40 inside the pressure compensated housing. The method comprises in a step S106 filling the pressure compensated housing with a dielectric liquid 30. The dielectric liquid 30 is a hydrocarbon dielectric liquid comprising isoparaffin.

The method may comprise an optional step S108 of lowering the pressure compensated housing 20 into a body of water 50. The body of water may be an ocean or a lake.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A pressure compensated subsea arrangement for housing of electric components, comprising:
   a pressure compensated housing, the pressure compensated housing is filled with an isoparaffinic hydrocarbon dielectric liquid;
   at least one electric component, the at least one electric component is positioned inside the pressure compensated housing, the isoparaffinic hydrocarbon dielectric liquid provides convection cooling of the at least one electric component within the pressure compensated housing at a subsea depth of at least 100 m.

2. The arrangement according to claim 1, wherein the hydrocarbon dielectric liquid comprises at least 50 Vol % isoparaffin.

3. The arrangement according to claim 2, wherein one of the at least one electric component is part of a power conversion unit or a static electric induction device.

4. The arrangement according to claim 2, wherein the hydrocarbon dielectric liquid has a dynamic viscosity at 4° C. of about 100 mPa·s to about 500 mPa·s between a pressure of about 100 bar to about 1000 bar.

5. The arrangement according to claim 2, wherein the hydrocarbon dielectric liquid has a dynamic viscosity at 4° C. of above about 500 mPa·s at a pressure above about 1000 bar.

6. The arrangement according to claim 2, wherein the hydrocarbon dielectric liquid has a thermal conductivity above 0.10 W/mK at about 30° C. temperature and about 1 bar pressure.

7. The arrangement according to claim 2, wherein the hydrocarbon dielectric liquid has a flash point above 165° C.

8. The arrangement according to claim 1, wherein the hydrocarbon dielectric liquid comprises at least 51 Vol % isoparaffin.

9. The arrangement according to claim 1, wherein the hydrocarbon dielectric liquid has a dynamic viscosity at 4° C. of about 100 mPa·s to about 500 mPa·s between a pressure of about 100 bar to about 1000 bar.

10. The arrangement according to claim 1, wherein the hydrocarbon dielectric liquid has a dynamic viscosity at 4° C. of above about 500 mPa·s at a pressure above about 1000 bar.

11. The arrangement according to claim 1, wherein the hydrocarbon dielectric liquid has a thermal conductivity above 0.10 W/mK at about 30° C. temperature and about 1 bar pressure.

12. The arrangement according to claim 1, wherein the hydrocarbon dielectric liquid has a flash point above 165° C.

13. The arrangement according to claim 1, wherein the hydrocarbon dielectric liquid has a dynamic viscosity less than 10 mPa·s at 50° C. and at 300 bar and has a thermal conductivity above 0.13 W/(m K) at 50° C. and at 300 bar.

14. The arrangement according to claim 1, wherein one of the at least one electric component is part of a semiconductor submodule.

15. The arrangement according to claim 1, wherein one of the at least one electric component is part of a power electronics building block, PEBB.

16. The arrangement according to claim 1, wherein the hydrocarbon dielectric liquid comprises at least 70 Vol % isoparaffin.

17. A method of manufacturing a pressure compensated subsea arrangement for housing of electric components, the method comprising:
   providing a pressure compensated housing;
   providing at least one electric component inside the pressure compensated housing; and
   filling the pressure compensated housing with an isoparaffinic hydrocarbon dielectric liquid, wherein the isoparaffinic hydrocarbon dielectric liquid provides convection cooling of the at least one electric component within the pressure compensated housing at a subsea depth of at least 100 m.

18. The method according to claim 17, further comprising:
   lowering the pressure compensated housing into a body of water.

19. The method according to claim 18, wherein said body of water is an ocean or a lake.

* * * * *